United States Patent
Yang et al.

(10) Patent No.: US 11,503,721 B2
(45) Date of Patent: Nov. 15, 2022

(54) PCB ASSEMBLY AND MANUFACTURING METHOD THEREOF

(71) Applicant: LG CHEM, LTD., Seoul (KR)

(72) Inventors: Seung-Min Yang, Daejeon (KR); Hak-In Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 222 days.

(21) Appl. No.: 16/759,552

(22) PCT Filed: Aug. 8, 2019

(86) PCT No.: PCT/KR2019/010011
§ 371 (c)(1),
(2) Date: Apr. 27, 2020

(87) PCT Pub. No.: WO2020/045851
PCT Pub. Date: Mar. 5, 2020

(65) Prior Publication Data
US 2021/0176868 A1 Jun. 10, 2021

(30) Foreign Application Priority Data
Aug. 28, 2018 (KR) .......... 10-2018-0101582

(51) Int. Cl.
*H05K 3/36* (2006.01)
*H01R 12/52* (2011.01)
(Continued)

(52) U.S. Cl.
CPC ............. *H05K 3/366* (2013.01); *H01R 12/52* (2013.01); *H01R 12/58* (2013.01); *H05K 1/115* (2013.01);
(Continued)

(58) Field of Classification Search
CPC .................... H01R 12/52; H01R 12/58; H05K 2203/1446; H05K 2201/10757;
(Continued)

(56) References Cited

U.S. PATENT DOCUMENTS 2,740,097 A * 3/1956 Edelman ................ H01R 12/52
439/786
4,335,272 A * 6/1982 Pittenger ................ H05K 1/148
174/254
(Continued)

FOREIGN PATENT DOCUMENTS

CN 1348677 A * 5/2002 ........ H01M 10/4257
CN 108140913 A 6/2018
(Continued)

OTHER PUBLICATIONS

International Search Report (PCT/ISA/210) issued in PCT/KR2019/010011, dated Nov. 27, 2019.
(Continued)

*Primary Examiner* — Marcus E Harcum
(74) *Attorney, Agent, or Firm* — Birch, Stewart, Kolasch & Birch, LLP

(57) ABSTRACT

Discussed is a PCB assembly and a manufacturing method of a PCB assembly in which at least two PCBs are electrically connected. The PCB assembly includes a connection metal pin having a body and legs, the body having electric conductivity, and having a pin shape elongated in one direction, a portion of the body being bent according to a predetermined angle of the at least two PCBs arranged in a rotated state, portions of the legs being bent and respectively extended in another direction from opposite ends of the body, the bent and extended portions of the legs being inserted through connection holes respectively formed in the at least two PCBs, and bent and extended terminals of the
(Continued)

legs respectively being bent inward to be tightly fixed to lower surfaces of the at least two PCBs.

12 Claims, 10 Drawing Sheets

(51) Int. Cl.
    *H01R 12/58*     (2011.01)
    *H05K 1/11*     (2006.01)

(52) U.S. Cl.
    CPC .......... *H05K 2201/10295* (2013.01); *H05K 2201/10757* (2013.01); *H05K 2203/1446* (2013.01)

(58) Field of Classification Search
    CPC ......... H05K 2201/10295; H05K 3/366; H05K 1/115; H05K 1/148
    USPC ...................................... 439/84, 65
    See application file for complete search history.

(56) References Cited

U.S. PATENT DOCUMENTS

| | | | |
|---|---|---|---|
| 4,742,183 A | 5/1988 | Soloway et al. | |
| 4,995,156 A | 2/1991 | Pinnavaia | |
| 5,525,763 A * | 6/1996 | Van Liere | H05K 3/366 174/265 |
| 5,920,465 A | 7/1999 | Tanaka | |
| 6,425,767 B1 * | 7/2002 | Lin | H01R 12/523 439/511 |
| 6,873,520 B2 * | 3/2005 | Takagi | H04M 1/0216 361/679.55 |
| 7,479,345 B2 * | 1/2009 | Nakamura | H01R 12/52 429/129 |
| 7,839,657 B2 * | 11/2010 | Nodine | H05K 1/148 361/776 |
| 10,321,580 B2 | 6/2019 | Heller | H05K 3/4007 |
| 10,587,064 B1 * | 3/2020 | Consoli | H05K 1/14 |
| 10,959,325 B2 * | 3/2021 | Tsorng | H05K 5/0208 |
| 10,971,880 B2 * | 4/2021 | Parker | H01R 43/205 |
| 2002/0078560 A1 * | 6/2002 | Reijnders | H05K 3/0052 29/846 |
| 2006/0223365 A1 * | 10/2006 | Campbell | H05K 1/141 439/540.1 |
| 2009/0117458 A1 | 5/2009 | Yun | |
| 2010/0254109 A1 | 10/2010 | Nakamura et al. | |
| 2011/0069465 A1 | 3/2011 | Hsieh | |
| 2014/0192530 A1 | 7/2014 | Liu | |
| 2014/0218954 A1 * | 8/2014 | Yoon | F21S 43/14 362/546 |
| 2014/0311777 A1 | 10/2014 | Park | |
| 2017/0069990 A1 * | 3/2017 | Sizemore | H05K 3/366 |
| 2018/0035544 A1 * | 2/2018 | Heller | H05K 3/366 |
| 2018/0168042 A1 | 6/2018 | Hartman | |
| 2018/0301674 A1 | 10/2018 | Lee et al. | |
| 2020/0267839 A1 * | 8/2020 | Woo | H05K 1/0281 |

FOREIGN PATENT DOCUMENTS

| | | | |
|---|---|---|---|
| DE | 10 2007 046 493 A1 | 4/2009 | |
| DE | 102008058749 A1 * | 6/2009 | ............. H05K 3/366 |
| EP | 1 220 587 A2 | 7/2002 | |
| EP | 2581987 A1 * | 4/2013 | ............. H01R 12/58 |
| FR | 2693341 A1 * | 1/1994 | ............. G04G 17/02 |
| GB | 2 229 129 A | 9/1990 | |
| JP | 55-160487 A | 12/1980 | |
| JP | 55-173873 U | 12/1980 | |
| JP | 56-101680 U | 8/1981 | |
| JP | 60-109295 A | 6/1985 | |
| JP | 8-236895 A | 9/1996 | |
| JP | 10-209594 A | 8/1998 | |
| JP | 10-224007 A | 8/1998 | |
| JP | 2000-277881 A | 10/2000 | |
| JP | 2004-311813 A | 11/2004 | |
| JP | 2004-319525 A | 11/2004 | |
| JP | 2005-56952 A | 3/2005 | |
| JP | 2010-225700 A | 10/2010 | |
| JP | 2013-229366 A | 11/2013 | |
| KR | 1989-0005936 Y1 | 8/1989 | |
| KR | 20-0141767 Y1 | 5/1999 | |
| KR | 10-0904710 B1 | 6/2009 | |
| KR | 20-2010-0001678 U | 2/2010 | |
| KR | 10-2013-0053865 A | 5/2013 | |
| KR | 10-1692125 B1 | 1/2017 | |
| KR | 10-1750485 B1 | 6/2017 | |
| WO | WO-2007036181 A1 * | 4/2007 | ............. H05K 3/366 |

OTHER PUBLICATIONS

Partial Supplementary European Search Report for European Application No. 19855897.5, dated Jan. 29, 2021.
Extended European Search Report for European Application No. 19855897.5, dated May 26, 2021.

* cited by examiner

PCB ASSEMBLY AND MANUFACTURING METHOD THEREOF

TECHNICAL FIELD

The present disclosure relates to a PCB assembly and a manufacturing method thereof, and more particularly, to a PCB assembly capable of reducing manufacturing costs and improving manufacturing efficiency and a manufacturing method thereof.

The present application claims priority to Korean Patent Application No. 10-2018-0101582 filed on Aug. 28, 2018 in the Republic of Korea, the disclosures of which are incorporated herein by reference.

BACKGROUND ART

In recent years, the demand for portable electronic products such as notebooks, video cameras, mobile phones, or the like is rapidly increasing, and the development of electric vehicles, energy storage batteries, robots, satellites, or the like is in earnest. For this reason, high-performance secondary batteries enabling repeated charging and discharging are being actively researched.

Secondary batteries currently commercialized include nickel cadmium batteries, nickel hydrogen batteries, nickel zinc batteries, lithium secondary batteries and so on. Among them, the lithium secondary batteries are more highlighted in comparison to nickel-based secondary batteries due to advantages such as free charging and discharging, caused by substantially no memory effect, very low self-discharge rate, and high energy density.

The lithium secondary battery mainly uses lithium-based oxides and carbonaceous materials as a positive electrode active material and a negative electrode active material, respectively. In addition, the lithium secondary battery includes an electrode assembly in which a positive electrode plate coated with the positive electrode active material and a negative electrode plate coated with the negative electrode active material are disposed with a separator being interposed therebetween, and an exterior hermetically containing the electrode assembly together with an electrolyte.

In using the secondary battery, it is very important to check the temperature, current and voltage of the secondary battery in terms of preventing the occurrence of safety accidents and improving the secondary battery life.

In other words, as the performance of electronic devices improves day by day, the performance of secondary batteries for supplying a high output power at one time is also improving. In particular, since the secondary batteries used in the high-power electronic devices generate a large amount of heat, an accident such as ignition or explosion may be caused if the temperature rise is not properly handled.

To this end, a PCB assembly applied to the electronic device may include a negative temperature coefficient (NTC) device, a positive temperature coefficient device (PTC) element, or the like as a temperature element used for measuring the temperature of a secondary battery.

In addition, for example, the PCB assembly provided to a secondary battery pack needs to be embedded in a narrow space of a pack case. For this reason, the PCB assembly includes a plurality of PCBs, and the plurality of PCBs may have various arrangements.

In this case, in order to electrically connect the PCBs and rotate the plurality of boards in various forms, a flexible PCB to which a flexible material board is applied is necessary.

However, the flexible PCB is more expensive than a rigid PCB and requires additional components such as connectors, which needs additional cost. In particular, the process of electrically connecting the flexible PCB and the rigid PCB requires laborious precise works, which inevitably increases the manufacturing costs.

DISCLOSURE

Technical Problem

The present disclosure is designed to solve the problems of the related art, and therefore the present disclosure is directed to providing a PCB assembly, which may reduce manufacturing costs and improve manufacturing efficiency.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a PCB assembly, comprising:

at least two PCBs, each having a board with an upper surface and a lower surface relatively wider than horizontal side surfaces thereof, the board being partially perforated in an upper and lower direction to form a connection hole, a connection conductor electrically connected to a printed circuit provided on the board being formed in the connection hole to be exposed out, the at least two PCBs being arranged such that the upper surfaces or the lower surfaces of the boards are rotated to form a predetermined angle therebetween; and a connection metal pin having a body and a leg, the body having electric conductivity, the body having a pin shape elongated in one direction, a portion of the body being bent according to the predetermined angle of the at least two PCBs arranged in a rotated state, the leg being bent and extended in another direction from both ends of the body, the bent and extended portion of the leg being inserted through the connection hole respectively formed in the at least two PCBs, a bent and extended terminal of the leg being bent inward to be tightly fixed to a lower surface of the PCB.

Also, a fixing groove may be formed at the lower surface of the PCB to have an inner shape in which a bent and extended end of the leg of the connection metal pin is inserted and fixed.

Moreover, a cantilever having a protrusion shape protrusively extending toward the leg of the connection metal pin to block the leg of the connection metal pin inward from the outside and bent only in an inner direction may be formed in the fixing groove.

In addition, an adhesive material may be buried and solidified in the fixing groove in which the leg of the connection metal pin is inserted and fixed.

Also, a portion of the body of the connection metal pin may be bent according to the predetermined angle of the at least two PCBs arranged in a rotated state.

Moreover, the PCB assembly may further comprise an angle fixing member having a linear fitting groove recessed inward so that the bent portion of the body of the connection metal pin is inserted and fixed therein.

In addition, a fastening protrusion protruding outward may be formed on the lower surface of each of the at least two PCBs, and the fastening protrusion of one of the at least two PCBs may have a hooking structure to meet another fastening protrusion and be fastened thereto.

Further, a stopper protrusion protruding outward may be formed on the lower surface of at least one of the at least two PCBs to support the lower surface of another PCB such that the another PCB does not rotate further.

Also, in another aspect of the present disclosure, there is also provided a battery pack, comprising the PCB assembly according to the present disclosure.

Further, in another aspect of the present disclosure, there is also provided an electronic device, comprising the battery pack according to the present disclosure.

In another aspect of the present disclosure, there is also provided a manufacturing method of a PCB assembly in which at least two PCBs are electrically connected, the manufacturing method comprising:

preparing at least two PCBs, each having a board with an upper surface and a lower surface relatively wider than horizontal side surfaces, the board being partially perforated in an upper and lower direction to form a connection hole, a connection conductor electrically connected to a printed circuit provided on the board being formed in the connection hole to be exposed out;

inserting both ends of a connection metal pin with electric conductivity into connection holes respectively formed in the at least two PCBs to electrically connect the connection conductors of the at least two PCBs;

bending both ends of the connection metal pin passing through the connection holes inward to be tightly fixed to a lower surface of the PCB; and arranging the at least two electrically connected PCBs such that the upper surfaces or the lower surfaces of the at least two PCBs are rotated to form a predetermined angle therebetween.

Further, the bending step may be performed by a bending unit.

Specifically, the bending unit may include:

a grip part having tongs to grip at least a portion of the connection metal pin to fix the connection metal pin;

a pressing part having a press to press the connection metal pin held by the grip part downward; and a support part having a concave groove recessed into a body of the support part to press each leg formed at both ends of the connection metal pin so that the leg is bent in an inner direction of the PCB.

Also, the bending unit may further include a bending part having a bending jig to bend the body of the connection metal pin at a predetermined angle.

Further, in the arranging step, the bending part may be used to bend a portion of the body of the connection metal pin at a predetermined angle.

In addition, the manufacturing method according to the present disclosure may further comprise, after the arranging step, soldering the leg of the connection metal pin, which passes through the connection hole formed in each of the at least two PCBs, with the connection hole.

Advantageous Effects

According to an embodiment of the present disclosure, if the PCB assembly of the present disclosure includes at least two PCBs and connection metal pins fixed in the connection holes formed in the PCBs, the at least two PCBs may be electrically connected and arranged in a rotated state at a predetermined angle.

In addition, according to an embodiment of the present disclosure, since a fixing groove is formed at the lower surface of the PCB, the bent and extended end of the leg of the connection metal pin may be stably inserted and fixed. That is, if the bent and extended end of the leg of the connection metal pin is tightly fixed to the flat surface of the lower surface of the PCB, the leg of the connection metal pin is deformed according to the movement of the at least two PCBs, thereby releasing the fastening structure. Meanwhile, since the fixing groove restricts movement of the extended end of the leg of the connection metal pin, it is possible to prevent the connection metal pin from deforming or deviating.

Further, according to an embodiment of the present disclosure, since a cantilever having a protrusion shape is formed inside the fixing groove of the PCB, it is possible to prevent the leg of the connection metal pin located inside the fixing groove from deviating. Moreover, since the cantilever has an elastic portion that is bent only into the fixing groove, when the leg is inserted into the fixing groove, the elastic portion may be elastically bent inward, thereby preventing the cantilever from being damaged. On the contrary, the elastic portion may prevent the leg from deviating from the fixing groove.

Also, according to an embodiment of the present disclosure, since a portion of the body of the connection metal pin is bent according to a predetermined angle of the at least two PCBs that are arranged in a rotated state, the at least two PCBs may be easily arranged in a rotated state. Accordingly, the manufacturing process of the PCB assembly may be perfected more effectively.

In addition, according to an embodiment of the present disclosure, since the PCB assembly includes an angle fixing member to maintain the bent shape of the connection metal pin, it is possible to stably maintain the rotated arrangement of the at least two PCBs. Accordingly, the manufacturing efficiency of the product or the durability of the product may be further improved.

Moreover, according to another embodiment of the present disclosure, since a hooking structure is provided such that one fastening protrusion among the fastening protrusion of the at least two PCBs meets another fastening protrusion and is fastened thereto, it is possible to effectively maintain the arrangement of the at least two PCBs rotated at a predetermined angle. As a result, problems such as poor connection caused by movement of the at least two PCBs may be reduced.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Figure 1:
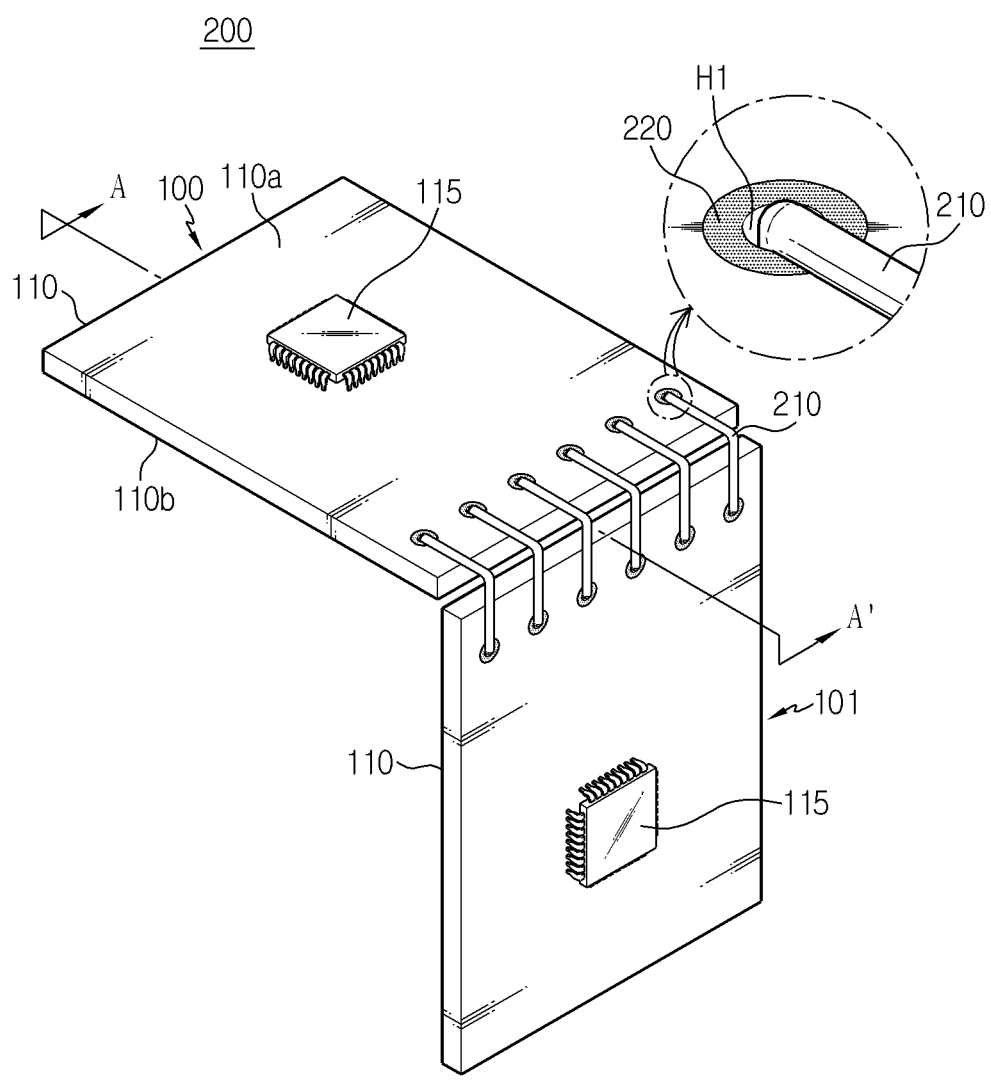
FIG. 1 is a perspective view schematically showing components of a PCB assembly according to an embodiment of the present disclosure.

FIG. 1 is a perspective view schematically showing components of a PCB assembly according to an embodiment of the present disclosure. Also, FIG. 2 is a side sectional view schematically showing components of the PCB assembly, taken along the line A-A' of FIG. 1.

Figure 2:
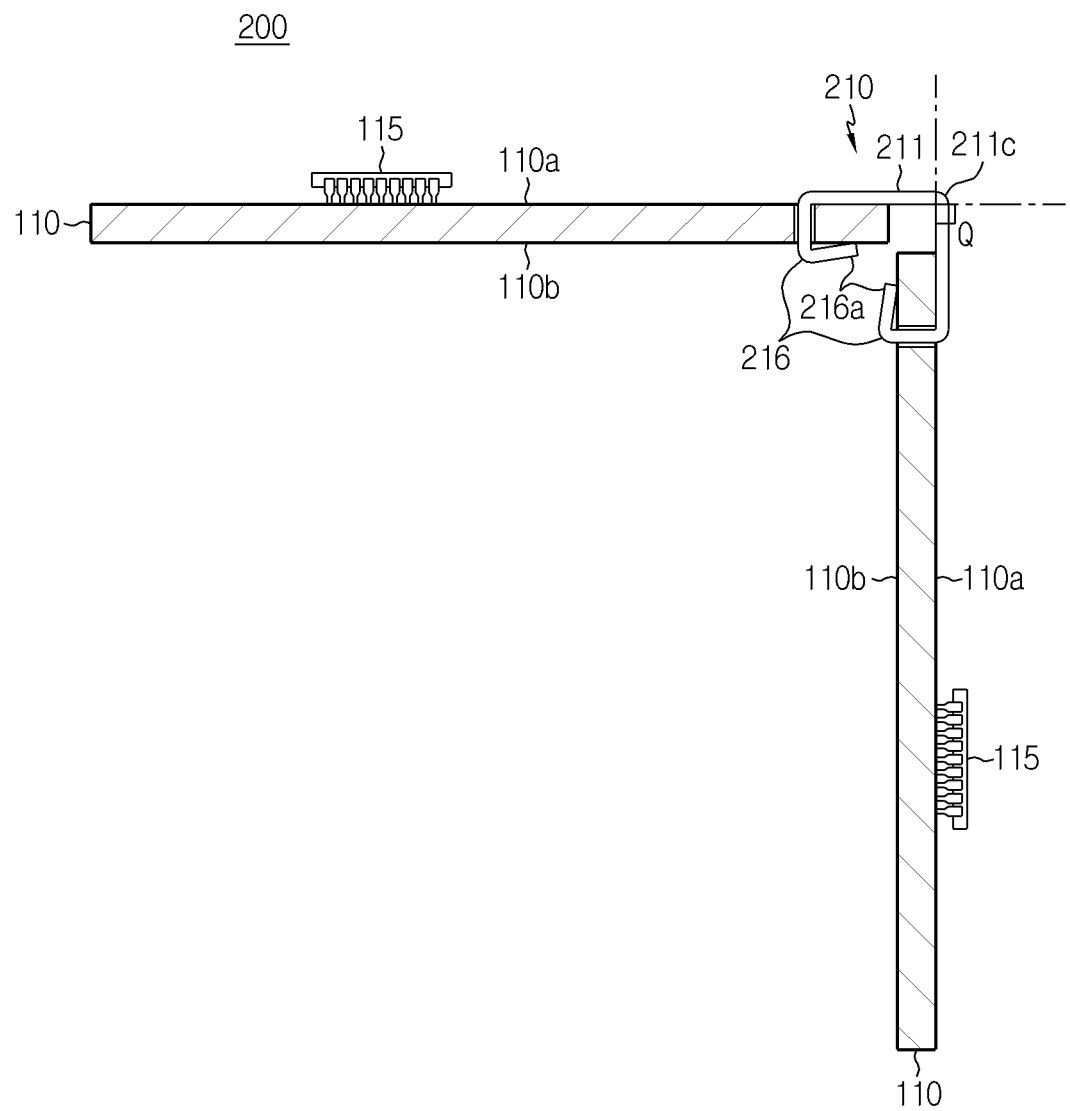
FIG. 2 is a side sectional view schematically showing components of the PCB assembly, taken along the line A-A' of FIG. 1.

Referring to FIGS. 1 and 2, a PCB assembly 200 according to an embodiment of the present disclosure includes at least two PCBs 100, 101 and a connection metal pin 210 for electrically and physically connecting the at least two PCBs 100, 101.

Specifically, the PCB 100 may include a board 110 having an upper surface and a lower surface that are relatively wider than a horizontal side surface thereof. In addition, the PCB 100 may be a rigid PCB having a rigid insulating layer. Further, the board 110 may include a plurality of insulating layers (not shown) and a plurality of conductive material layers (not shown) interposed between the plurality of insulation layers. Also, the board 110 may have a printed circuit (not shown) made of a conductive material layer.

For example, the printed circuit may be formed by printing the conductive material layer with an acid-resistant ink according to a wiring drawing and then immersing the conductive material layer in a corrosion solution such as iron (III) chloride so that only the wiring portion is left in the conductive material layer. However, the printed circuit may be formed by various known manners, without being limited to the above.

In addition, an electronic element 115 electrically connected to the plurality of conductive material layers may be mounted to the board 110.

For example, a temperature element may be mounted to the PCB 100. Also, various components such as a logic circuit chip and/or a switching element for controlling the operation of battery cells may be mounted to the PCB 100, in addition to the temperature element.

Further, the board 110 may be partially perforated in the upper and lower direction to form a plurality of connection holes H1. In addition, the connection hole H1 may be formed such that a connection conductor 220 electrically connected to the printed circuit provided at the board 110 is exposed out. Also, for example, the connection conductor 220 may be copper, silver, gold, platinum, or the like. In particular, the connection conductor 220 may be a gold-plated material. Gold not only has excellent electric conductivity, but also has excellent thermal conductivity, which may further improve the performance of the product.

For example, as shown in FIG. 1, four connection holes H1 may be formed in the each of two PCBs 100, 101. In addition, the connection conductor 220 may be formed on the inside and the peripheral area of the outer side surface of the connection hole H1 of the PCB 100 by coating.

Also, the at least two PCBs 100, 101 may be arranged in a rotated state such that upper surfaces 110a or lower surfaces 110b of the boards 110 form a predetermined angle Q. More specifically, the at least two PCBs 100, 101 may be arranged such that an angle Q formed by the upper surfaces 110a or the lower surfaces 110b of the boards 110 is 90 degree between neighboring PCBs 100. For example, as shown in FIG. 2, the two PCBs 100, 101 may be arranged such that an angle Q formed by the upper surfaces 110a of the boards 110 is 90 degree.

In addition, the connection metal pin 210 may have a material with electric conductivity. For example, the connection metal pin 210 may have at least one of nickel, copper, aluminum, iron, silver, tin, and alloys thereof.

Further, the connection metal pin 210 may include a shaped body 211 having a pin shape and extending in one direction. In addition, another portion of the connection metal pin 210 may be bent according to the predetermined angle of the at least two PCBs 100, 101 arranged in a rotated state.

For example, as shown in FIG. 2, a portion of the body 211 of the connection metal pin 210 may have a pin shape extending in one direction. Moreover, a center portion 211c of the body 211 of the connection metal pin 210 may have a shape bent at the angle of the at least two PCBs 100, 101 arranged in a rotated state, namely at a 90 degree angle.

In addition, the connection metal pin 210 may have a leg 216 extending in another direction from both ends of the body 211. Further, a bent and extended portion of the leg 216 may be inserted through a connection hole H1 formed in each of the at least two PCBs 100, 101. In this case, the leg 216 may be in contact with the connection conductor 220 exposed out from the inside of the connection hole H1.

Further, the connection hole H1 may electrically connect the leg 216 of the connection metal pin 210 and the connection conductor 220 formed at the connection hole H1 of the PCB 100 by means of a soldering process. Specifically, a molten solder (not shown) may be added to the connection hole H1 and the leg 216 of the connection metal pin 210 and then solidified to adhere the connection hole H1 and the leg 216. For example, the solder may be added to the inside and the outside of the connection hole H1 into which the leg 216 is inserted. At this time, the solder may be buried and filled in the connection hole H1.

In addition, a bent and extended terminal 216a of the leg 216 may be bent inward to be tightly fixed to the lower surface 100b of the PCB 100. That is, the bent portion of the terminal 216a may have a curved form or a sharply folded form.

Thus, according to this configuration of the present disclosure, if the PCB assembly 200 includes the at least two PCBs 100, 101 and the connection metal pin 210 respectively inserted and fixed in the connection holes H1 of the at least two PCBs 100, 101, the at least two PCBs 100, 101 may be electrically connected to each other, and the at least two PCBs 100, 101 may be arranged in a rotated state at a predetermined angle.

Further, according to the present disclosure, the PCB assembly arranged in a rotated state at a predetermined angle may be configured using only rigid PCBs.

Accordingly, it is possible to solve the conventional problem of using at least one expensive flexible PCB to arrange the plurality of PCBs 100 in a rotated state. In addition, the complicated and laborious work for connecting the plurality of PCBs 100 may be performed easily and quickly using the connection metal pin 210, thereby greatly improving the efficiency of the manufacturing process.

Figure 3:
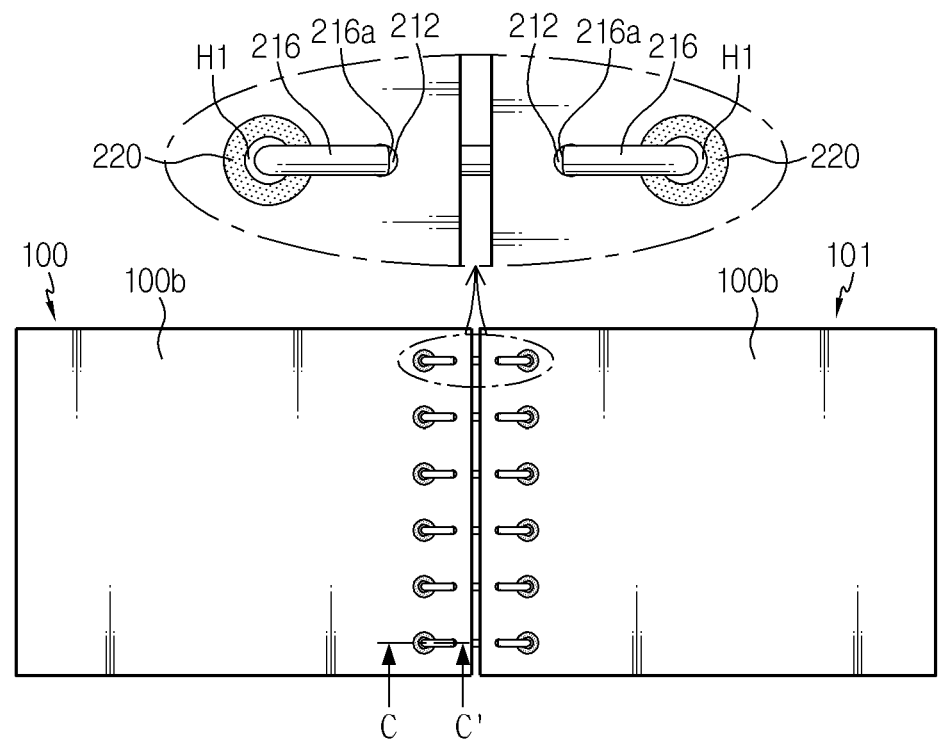
FIG. 3 is a bottom view schematically showing a lower surface of PCBs, employed at the PCB assembly according to an embodiment of the present disclosure.
Figure 4:
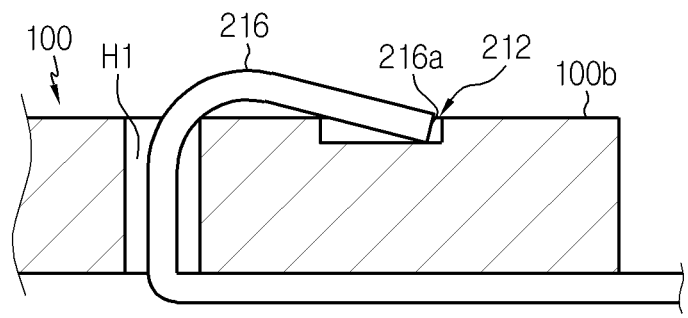
FIG. 4 is a partial sectional view schematically showing the PCB, taken along the line C-C' of FIG. 3.

FIG. 3 is a bottom view schematically showing a lower surface of PCBs, employed at the PCB assembly according to an embodiment of the present disclosure. Also, FIG. 4 is a partial sectional view schematically showing the PCB, taken along the line C-C' of FIG. 3. Here, FIGS. 3 and 4 show the PCB assembly of the PCB assembly before being rotated with respect to each other, for convenience of description. That is, in FIG. 3, the PCBs are arranged parallel to each other.

Referring to FIGS. 3 and 4, a fixing groove 212 recessed inward may be formed at the lower surface 100b of the PCB 100. Specifically, the fixing groove 212 may have an internal shape such that the bent and extended end of the leg 216 of the connection metal pin 210 is inserted and fixed therein.

In addition, the fixing groove 212 may be formed by etching so that a groove is formed at the lower surface 100b of the PCB 100 in advance, or by digging using a sharp instrument. Alternatively, the fixing groove 212 may be formed as the bent and extended end 216a of the leg 216 of the connection metal pin 210 is inserted through the lower surface 100b of the PCB 100 due to a pressing force while the end 216a is tightly fixed to the lower surface 100b of the PCB 100. In this case, the material of the lower surface 100b of the PCB 100 may have a lower hardness than that of the connection metal pin 210. For example, as shown in FIG. 4, the fixing groove 212 recessed inward may be formed at the lower surface 100b of the PCB 100. In addition, the extended end 216a of the leg 216 of the connection metal pin 210 may be inserted and fixed in the fixing groove 212.

Thus, according to this configuration of the present disclosure, since the fixing groove 212 is formed at the lower surface 100b of the PCB 100, the bent and extended end 216a of the leg 216 of the connection metal pin 210 may be stably inserted and fixed. That is, when the bent and extended end 216a of the leg 216 of the connection metal pin 210 is tightly fixed to the flat lower surface 100b of the PCB 100, according to the movement of the at least two PCBs 100, 101, the leg 216 of the connection metal pin 210 may be deformed or released. Meanwhile, the fixing groove 212 may prevent the connection metal pin 210 from deforming or deviating by restricting the movement of the extended end 216a of the leg 216 of the connection metal pin 210.

Figure 5:
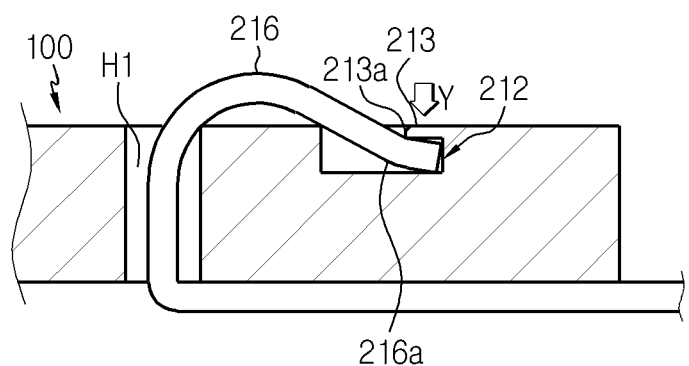
FIG. 5 is a partial perspective view schematically showing a PCB according to another embodiment of the present disclosure.

FIG. 5 is a partial perspective view schematically showing a PCB according to another embodiment of the present disclosure.

Referring to FIG. 5 along with FIG. 3, the PCB 100 of FIG. 5 according to another embodiment of the present disclosure may further include a cantilever 213 formed at the inside of the fixing groove 212, compared to the fixing groove 212 of FIG. 4.

Specifically, the cantilever 213 formed in the fixing groove 212 may have a protrusion shape protrusively extending from the inner surface of the fixing groove 212 toward the leg 216 of the connection metal pin 210. That is, the cantilever 213 may have a protrusion shape to block the leg 216 of the connection metal pin 210 in the inner direction Y from the outside. In addition, the cantilever 213 may have an elastic portion 213a that is elastically biased to be bent only in the inner direction Y of the fixing groove 212 of the PCB 100.

For example, as shown in FIG. 5, the fixing groove 212 recessed in the inner direction Y may be formed at the lower surface 100b of the PCB 100. In addition, the cantilever 213 having a protrusion shape protrusively extending toward the leg 216 of the connection metal pin 210 may be formed in the fixing groove 212. Also, the cantilever 213 may be located to support a portion of the leg 216 of the connection metal pin 210 in the inner direction Y. Further, the elastic portion 213a elastically biased to be bent only in the inner direction Y of the fixing groove 212 of the PCB 100 may be formed at a protrusively extended terminal of the cantilever 213.

Thus, according to this configuration of the present disclosure, since the cantilever 213 having a protrusion shape is formed inside the fixing groove 212, it is possible to prevent the leg 216 of the connection metal pin 210 located inside the fixing groove 212 from deviating out again. Further, since the cantilever 213 has the elastic portion 213a that is bent only in the inner direction Y of the fixing groove 212, the cantilever 213 may be prevented from being damaged while being elastically bent in the inner direction Y when the leg 216 is inserted into the fixing groove 212. Moreover, the elastic portion 213a, which is bent only in the inner direction Y, may prevent the leg 216 from deviating the fixing groove 212.

Figure 6:
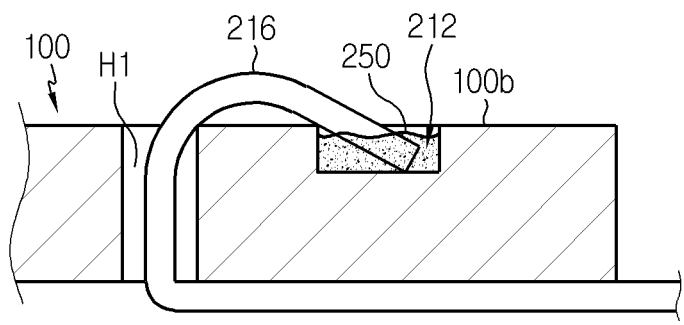
FIG. 6 is a partial sectional view schematically showing a PCB according to still another embodiment of the present disclosure.

FIG. 6 is a partial sectional view schematically showing a PCB according to still another embodiment of the present disclosure.

Referring to FIG. 6, an adhesive material 250 may be buried and solidified in the fixing groove 212 of the PCB 100 of FIG. 6 according to still another embodiment of the present disclosure. That is, the fixing groove 212 in which the leg 216 of the connection metal pin 210 is inserted and fixed may be tightly fixed to the lower surface 100b of the PCB 100 by the solidified adhesive material 250.

More specifically, the adhesive material 250 may be an adhesive polymer resin. For example, the adhesive material 250 may be an epoxy resin. However, the present invention is not limited only to the examples, and any adhesive material having sufficient adhesive strength to fix the leg 216 of the connection metal pin 210 may be applied.

Thus, according to this configuration of the present disclosure, if the adhesive material 250 is buried and solidified so that the terminal of the leg 216 of the connection metal pin 210 is inserted and fixed in the fixing groove 212, it is possible to effectively prevent the connection metal pin 210 from deviating from the PCB assembly 200. That is, the durability of the PCB assembly 200 may be improved.

Meanwhile, referring to FIG. 2 again, a portion 211c of the body 211 of the connection metal pin 210 may be bent according to the predetermined angle of the at least two PCBs 100, 101 arranged in a rotated state. For example, as shown in FIG. 2, as the two PCBs 100, 101 are rotated at 90 degree with respect to each other, the extended longitudinal center portion 211c of the body 211 of the connection metal pin 210 may be bent at 90 degree.

Thus, according to this configuration of the present disclosure, since a portion of the body 211 of the connection metal pin 210 is bent according to the predetermined angle of the at least the two PCBs 100, 101 arranged in a rotated state, the at least two PCBs 100, 101 may be easily arranged in a rotated state. Accordingly, the manufacturing process of the PCB assembly 200 may be effectively performed.

Figure 7:
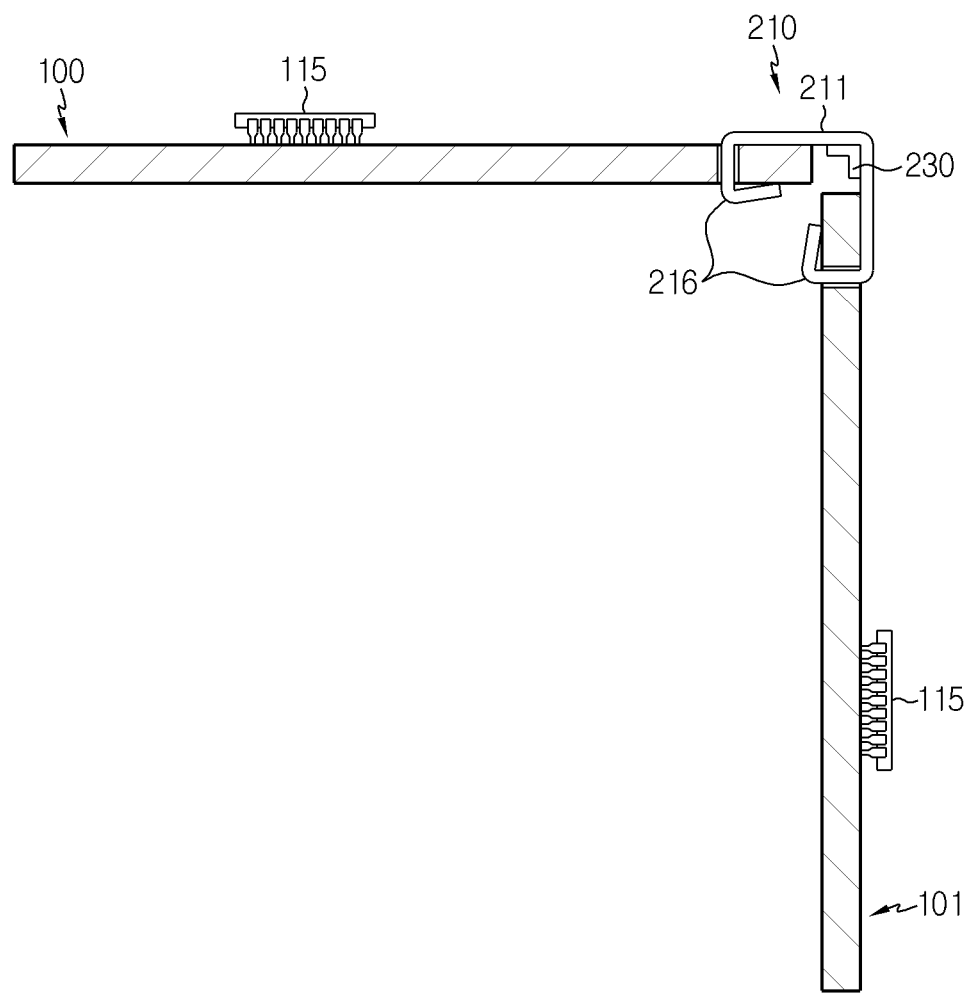
FIG. 7 is a side sectional view schematically showing a PCB assembly according to another embodiment of the present disclosure.

FIG. 7 is a side sectional view schematically showing a PCB assembly according to another embodiment of the present disclosure. Also, FIG. 8 is a perspective view schematically showing an angle fixing member, employed at the PCB assembly according to another embodiment of the present disclosure.

Figure 8:
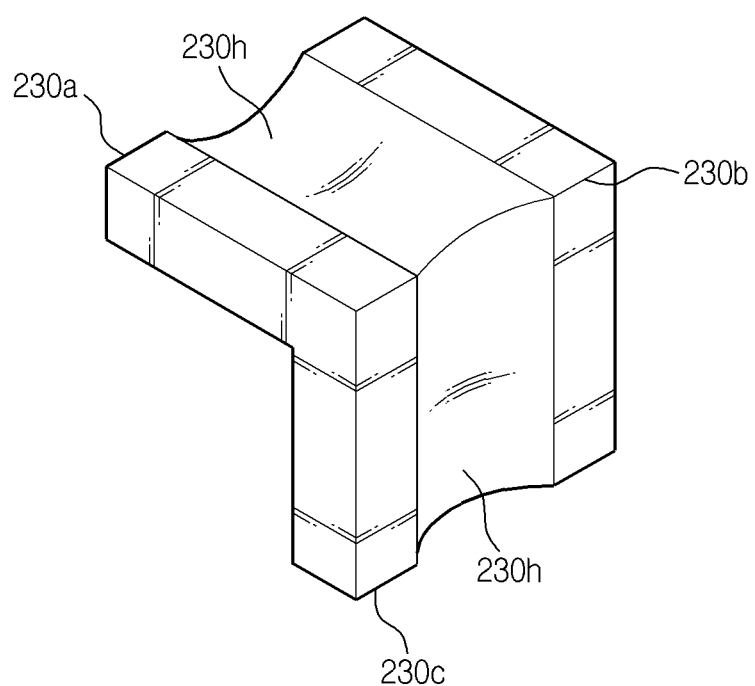
FIG. 8 is a perspective view schematically showing an angle fixing member, employed at the PCB assembly according to another embodiment of the present disclosure.

Referring to FIGS. 7 and 8, when comparing with the PCB assembly of FIG. 2, the PCB assembly 200 of FIG. 7 may further include an angle fixing member 230. In addition, the body 211 of the connection metal pin 210 may be bent according to the predetermined angle of the at least two PCBs 100, 101 arranged in a rotated form. In addition, the angle fixing member 230 may have a structure capable of fixing the bent portion of the body 211 of the connection metal pin 210.

For example, as shown in FIG. 7, the PCB assembly 200 having two PCBs 100, 101 may further include the angle fixing member 230 coupled to a portion of the body 211 of the connection metal pin 210.

More specifically, the body of the angle fixing member 230 may have a form bent at a predetermined angle. In this case, the bent angle of the angle fixing member 230 may be equal or close to the predetermined angle of the at least two PCBs arranged in a rotated state.

Further, a linear fitting groove 230h may be formed so that the bent portion of the body 211 of the connection metal pin 210 is inserted therein. In addition, the fitting groove 230h may be formed to be recessed into the body of the angle fixing member 230. Further, the fitting groove 230h may be formed at the upper surface and one horizontal side surface of the angle fixing member 230, respectively.

In addition, the fitting groove 230h may have a shape linearly extending from one side end 230a of the upper surface of the angle fixing member 230 to the other side end 230b thereof. Further, the fitting groove 230h may have a form linearly extending from the other side end 230b of one horizontal side surface of the angle fixing member 230 to a lower end 230c thereof.

For example, as shown in FIG. 8, the angle fixing member 230 may have the linear fitting groove 230h. The fitting groove 230h may be formed to be recessed inward at the upper surface and one horizontal side surface of the angle fixing member 230 so that a portion of the body 211 of the connection metal pin 210, which is bent at the predetermined angle, may be inserted therein.

Thus, according to this configuration of the present disclosure, since the PCB assembly 200 includes the angle fixing member 230 to maintain the bent shape of the connection metal pin 210, the arrangement of the at least two PCBs 100, 101 in a rotated state may be stably maintained, thereby preventing the PCB assembly 200 from deforming during manufacturing or product use. Accordingly, the manufacturing efficiency and the durability of the product may be further improved.

Figure 9:
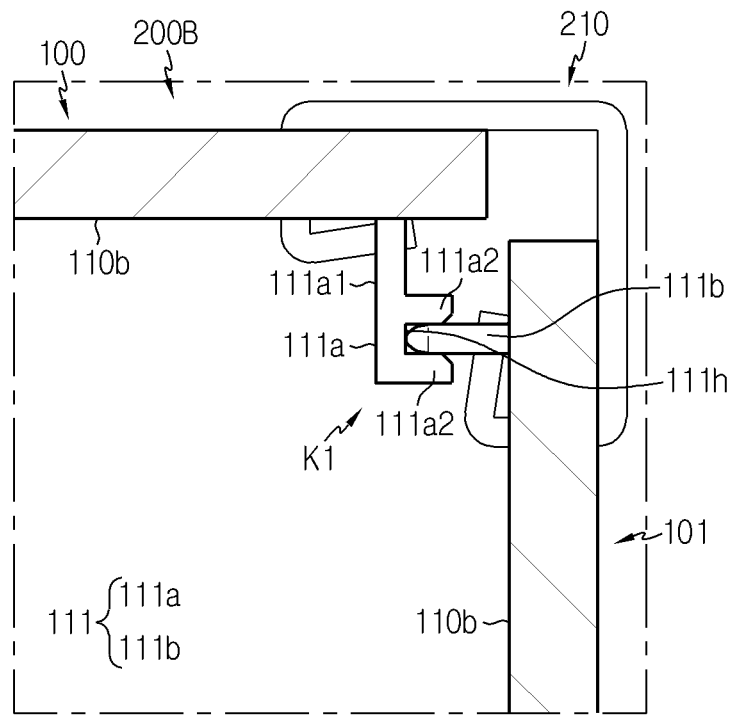
FIG. 9 is a partial enlarged side view schematically showing a portion of the PCB assembly according to another embodiment of the present disclosure.

FIG. 9 is a partial enlarged side view schematically showing a portion of the PCB assembly according to another embodiment of the present disclosure.

Referring to FIG. 9, a fastening protrusion 111 protruding outward may be formed on the lower surface of each of the at least two PCBs 100, 101 applied to the PCB assembly 200B according to another embodiment of the present disclosure.

Specifically, the fastening protrusions 111a, 111b respectively formed at the at least two PCBs 100, 101 may have a structure capable of meeting each other and be fastened to each other to restrain relative movement. For example, at least one 111a of the fastening protrusions 111a, 111b formed at the at least two PCBs 100, 101 may have a fastening groove 111h formed such that the opponent fastening protrusion 111b is inserted and fixed therein.

In addition, the other fastening protrusion 111b may have a protrusion structure with a size capable of being inserted into the fastening groove 111h at least partially. That is, for example, the fastening protrusion 111a of one of the at least two PCBs 100, 101 may have a hooking structure K1 to meet the other fastening protrusion 111b and be fastened thereto.

For example, as shown in FIG. 9, a body part 111a1 extending downward and an extension part 111a2 extending in the horizontal direction from the body part 111a1 are formed at the lower surface 100b of the upper PCB 100, which is located at an upper side among the two PCBs 100, 101. In addition, the extension part 111a2 may have the fastening groove 111h in which an inner space is formed so that a portion of another fastening protrusion 111 may be inserted therein.

In addition, the PCB 101 located at a lower side may have a fastening protrusion 111b formed at the lower surface 100b and having a different shape from the fastening protrusion 111a. Also, the fastening protrusion 111b having a different shape may be configured to be inserted and fixed in the fastening groove 111h formed at the fastening protrusion 111a of the PCB 100 located at an upper side. For example, the end of the fastening protrusion 111b having a different shape may have a thickness gradually decreasing in the extending direction such that the fastening protrusion 111b is easily inserted into the fastening groove 111h while moving upward.

Thus, according to this configuration of the present disclosure, since one fastening protrusions 111a among the fastening protrusions 111a, 111b of the at least two PCBs 100, 101 has the hooking structure K1 to meet meets the other fastening protrusion 111b and be fastened thereto, the arrangement of the at least two PCBs 100, 101 in a rotated state at a predetermined angle may be effectively maintained. Accordingly, it is possible to reduce the problems such as poor connection caused by the movement of the at least two PCBs 100, 101.

Figure 10:
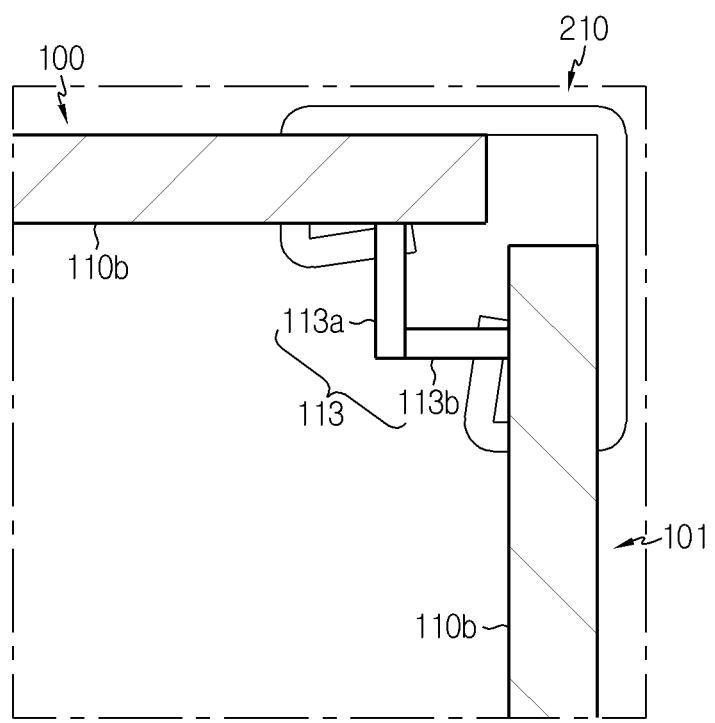
FIG. 10 is a partial enlarged side view schematically showing a portion of the PCB assembly according to still another embodiment of the present disclosure.

FIG. 10 is a partial enlarged side view schematically showing a portion of the PCB assembly according to still another embodiment of the present disclosure.

Referring to FIG. 10, the PCB assembly according to still another embodiment of the present disclosure may be configured such that a stopper protrusion 113 protruding outward may be formed at the upper surface of at least one 100 of the two PCBs 100, 101 to support the upper surface of the other PCB 101 so that the other PCB 101 does not rotate further.

Specifically, at least two stopper protrusions 113a, 113b protruding outward may be formed at the at least two PCBs 100, 101, respectively. Protrusively extending terminals of the at least two stopper protrusions 113a, 113b may be configured to meet and support each other so as to prevent the at least two PCBs 100, 101 from rotating with respect to each other.

For example, as shown in FIG. 10, two stopper protrusions 113 may be formed on the lower surface 100b of each of the two PCBs 100, 101. In addition, if the two PCBs 100, 101 are arranged to be rotated at a predetermined angle, the protrusively extending terminals of the two stopper protrusions 113 may meet each other to prevent the two PCBs 100, 101 from rotating further.

Thus, according to this configuration of the present disclosure, since the stopper protrusions 113 are formed on the lower surfaces of the at least two PCBs 100, 101, it is possible to prevent the at least two PCBs 100, 101 arranged to be rotated at a predetermined angle from rotating any further. Accordingly, problems such as poor connection or component damage caused by the movement of the at least two PCBs 100, 101 may be reduced.

Further, a battery pack (not shown) according to the present disclosure may include the PCB assembly 200. Specifically, the PCB assembly 200 may be, for example, used as at least a part of a protection circuit module provided in the battery pack applied to an energy storage device.

Also, an electronic device (not shown) according to the present disclosure may include the battery pack. For example, the battery pack may be accommodated in an external case of the electronic device.

Figure 11:
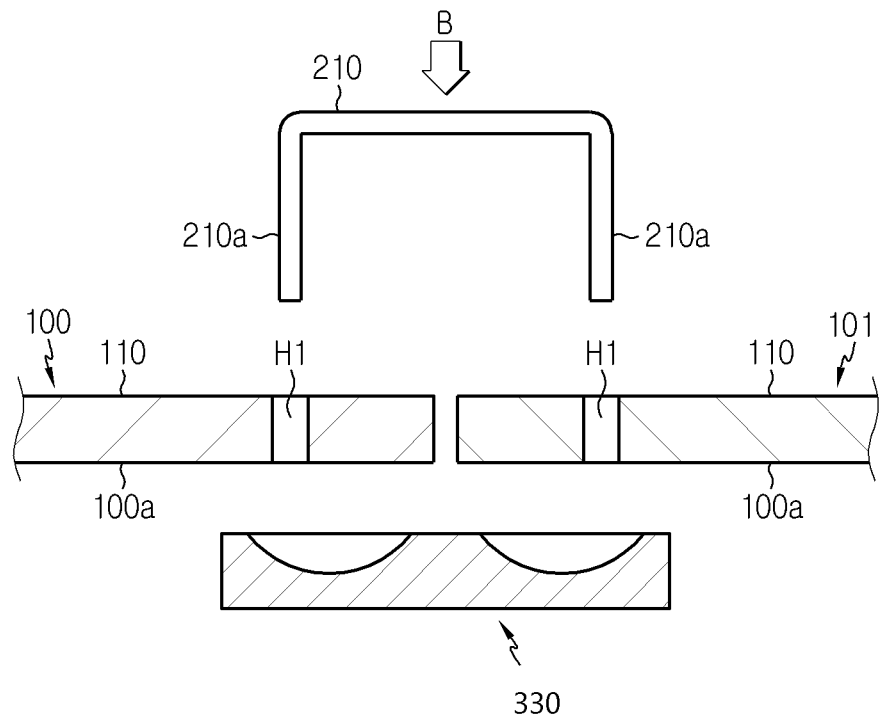
FIGS. 11 and 12 are side sectional views schematically showing a process of manufacturing a PCB assembly according to an embodiment of the present disclosure.
Figure 12:
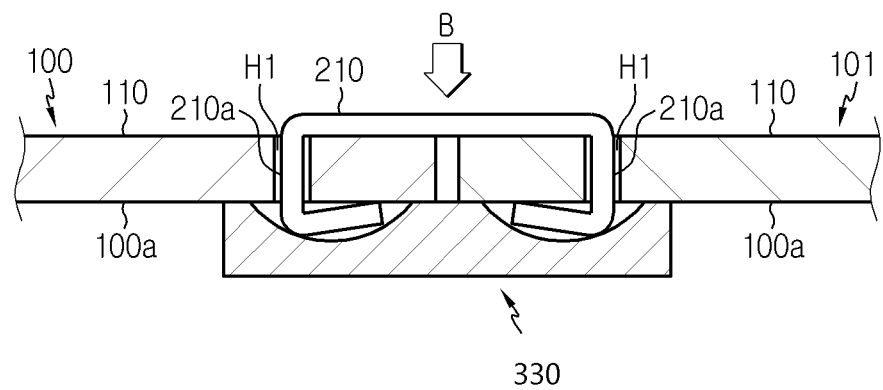

FIGS. 11 and 12 are side sectional views schematically showing a process of manufacturing a PCB assembly according to an embodiment of the present disclosure.

Referring to FIGS. 11 and 12 along with FIG. 1, a method of manufacturing the PCB assembly 200 in which at least two PCBs 100 and 101 are electrically connected according to an embodiment of the present disclosure may include preparing at least two PCBs 100, 101, electrically connecting the connection conductors 220 (FIG. 1) of the two PCBs 100, 101, bending both ends of the connection metal pin 210 inward, and arranging the at least two PCBs 100, 101 in a rotated state.

Specifically, in the step of preparing the at least two PCBs 100, 101, at least two boards 110 respectively having an upper surface and a lower surface relatively wider than a horizontal side surface thereof may be prepared. In addition, the board 110 may be partially perforated in the upper and lower direction to form a connection hole H1. Further, the connection hole H1 may be formed such that the connection conductor 220 electrically connected to a printed circuit provided on the board 110 is exposed out from the inside.

For example, as shown in FIG. 1, six connection holes H1 may be formed in each of the two PCBs 100, 101. In addition, the connection conductor 220 may be formed on the inside of the connection hole H1 of the PCB 100 and the peripheral area of the outer side surface thereof by coating.

In addition, in the step of electrically connecting the connection conductors 220 of the at least two PCBs 100, 101, both ends of the six connection metal pins 210 with electric conductivity may are be inserted through the connection holes H1 formed in each of the at least two PCBs 100, 101.

Further, the connection metal pin 210 partially inserted into the respective connection hole H1 comes into contact with the connection conductor 220 of the at least two PCBs 100, 101, thereby forming an electrical connection between the at least two PCBs 100, 101.

For example, as shown in FIGS. 11 and 12, both ends 210a of the connection metal pin 210 may be inserted through the connection hole H1 formed in each of the two PCBs 100, 101.

Further, in the step of bending both ends 210a of the connection metal pin 210 inward, both ends 210a of the connection metal pin 210 passing through the connection hole H1 may be bent in the inner direction of the PCB 100 so as to be tightly fixed to the lower surface 100b of the PCB 100.

For example, as shown in FIG. 12, since the connection metal pin 210 is pressed in the lower direction B in a state where both ends 210a of the connection metal pin 210 are supported upward by a support part 330, both ends 210a of the connection metal pin 210 may be bent in the inner direction of the PCB 100 to be tightly fixed to the lower surface 100b of the PCB 100.

Referring to FIG. 2 again, in the step of arranging the at least two PCBs 100, 101 in a rotated state, the at least two PCBs 100, 101 electrically connected to each other may be arranged in a rotated state such that the upper surfaces or the lower surfaces of the at least two PCBs 100, 101 form a predetermined angle Q from each other.

Thus, according to this configuration of the present disclosure, in the manufacturing method of the PCB assembly 200, by inserting and fixing the connection metal pin 210 in each of the connection holes H1 formed in the at least two PCBs 100, 101, the at least two PCBs 100, 101 may be electrically connected and simultaneously arranged in a rotated state at a predetermined angle Q (FIG. 2) in a state of being fastened to each other.

Accordingly, the PCB assembly 200 having at least two PCBs 100, 101 easily arranged in a rotated state may be configured using rigid PCBs 100 rather than flexible PCBs. Moreover, the work for connecting the plurality of PCBs 100 may be performed easily and quickly by using the connection metal pin 210, which greatly increases the efficiency of the manufacturing process.

Hereinafter, the bending step will be described in more detail.

Figure 13:
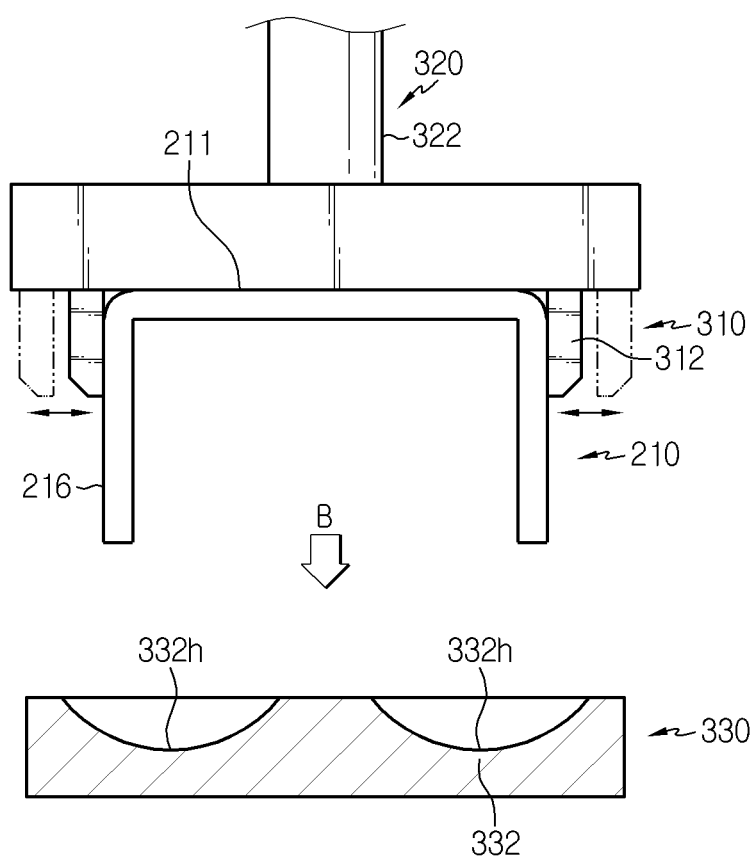
FIG. 13 is a front view schematically showing a bending unit that is used during the process of manufacturing a PCB assembly according to an embodiment of the present disclosure.

FIG. 13 is a front view schematically showing a bending unit that is used during the process of manufacturing a PCB assembly according to an embodiment of the present disclosure.

Referring to FIG. 13 along with FIGS. 11 and 12, the step of bending the legs 216 at both ends of the connection metal pin 210 may be performed using the support part 330. Specifically, a bending unit 300 may include a grip part 310, a pressing part 320, and the support part 330.

More specifically, the grip part 310 may include tongs 312 to hold and secure at least a portion of the body 211 of the connection metal pin 210. Also, the tongs 312 may be opened and closed using two legs. Through this operation, the tongs 312 may be used to hold or release a target.

For example, the tongs 312 of the grip part 310 may hold the body 211 of the connection metal pin 210. In addition, the pressing part 320 connected to an upper portion of the grip part 310 may include a press 322 to press the connection metal pin 210 held by the grip part 310 downward. That is, in a state where the grip part 310 holds the connection metal pin 210, the pressing part 320 may move the press 322 in the lower direction B.

Further, the support part 330 may be configured to press and bend the legs 216 formed at both ends of the connection metal pin 210 in the inner direction of the PCB 100. For example, the support part 330 may have a concave groove 332h formed to be recessed into a body 332 of the support part 330. That is, the legs 216 formed at both ends of the connection metal pin 210, which are moved downward by the press 322, may be bent in an inner direction by the concave groove 332h of the support part 330.

For example, as shown in FIG. 13, the bending unit 300 may include the grip part 310, the pressing part 320, and the support part 330. Also, the grip part 310 may include tongs 312 to hold or release the connection metal pin 210. Moreover, the pressing part 320 may include the press 322 to press the grip part 310 holding the connection metal pin 210 in the lower direction B. In addition, the support part 330 may have two concave grooves 332h configured to press and bend the legs 216 at both ends of the connection metal pin 210 in the inner direction of the PCB 100.

Thus, according to this configuration of the present disclosure, since the PCB assembly 200 is manufactured using the bending unit 300, the legs 216 of the connection metal pin 210 may be easily inserted into the connection holes H1 formed in the PCB 100, and simultaneously the legs 216 at both ends of the connection metal pin 210 may be easily bent to fasten the at least two PCBs 100, 101 by means of the connection metal pin 210. Accordingly, the PCB assembly 200 may be manufactured in a fast and simple manner using the bending unit 300, thereby reducing the manufacturing cost.

Figure 14:
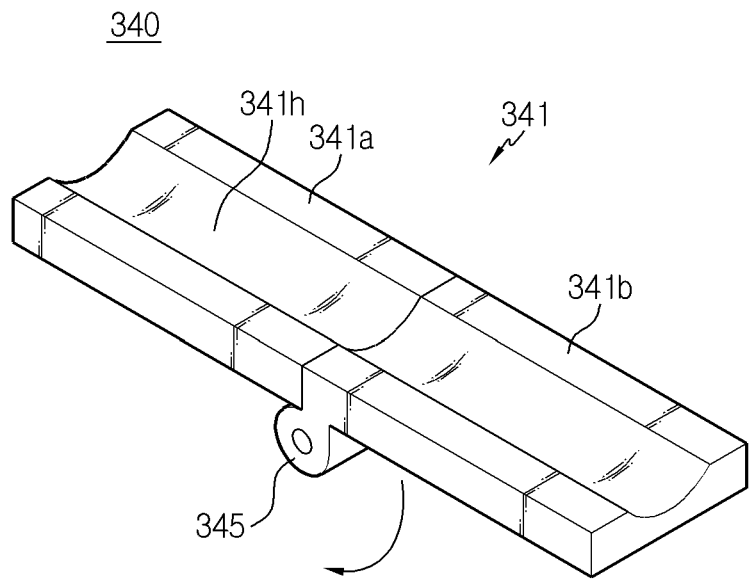
FIG. 14 is a perspective view schematically showing a bending part of the bending unit that is used in a manufacturing method of the PCB assembly according to an embodiment of the present disclosure.

FIG. 14 is a perspective view schematically showing a bending part of the bending unit that is used in a manufacturing method of the PCB assembly according to an embodiment of the present disclosure. Also, FIG. 15 is a perspective view schematically showing a bending part of the bending unit that is used in a manufacturing method of the PCB assembly according to an embodiment of the present disclosure.

Figure 15:
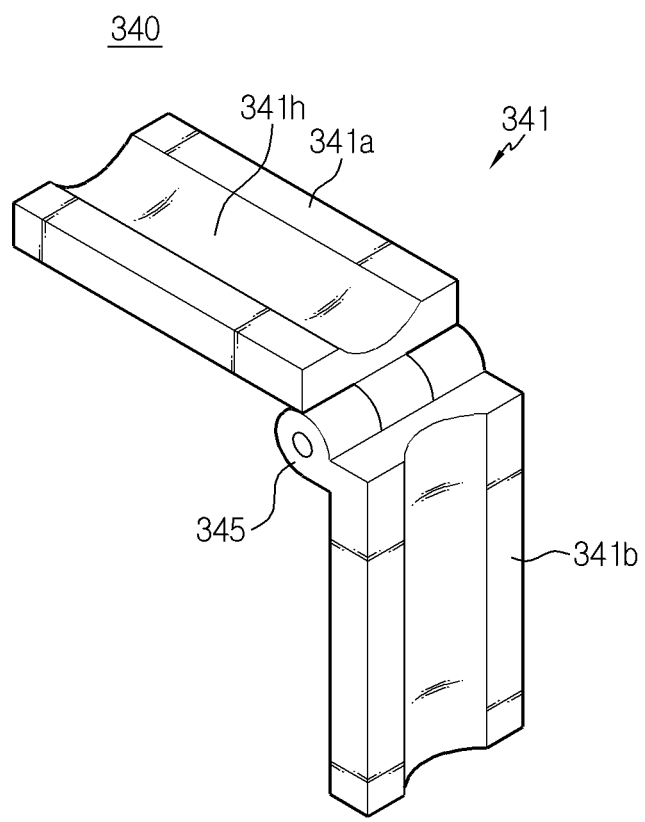
FIG. 15 is a perspective view schematically showing a bending part of the bending unit that is used in a manufacturing method of the PCB assembly according to an embodiment of the present disclosure.

Referring to FIGS. 14 and 15 along with FIG. 2, the bending unit 300 may further include a bending part 340 having a bending jig 341 for bending the body 211 of the connection metal pin 210 at a predetermined angle.

Specifically, the bending part 340 may have a linear dented groove 341h into which at least a portion of the body 211 of the connection metal pin 210 is inserted. In addition, the bending part 340 may have a structure in which two blocks are connected to each other by a hinge structure 345.

Moreover, the two blocks 341a, 341b of the bending part 340 may be rotated by means of the hinge structure 345. In addition, the two blocks 341a, 341b may be rotated in a state where the connection metal pin 210 is inserted into the dented groove 341h. Accordingly, the body 211 of the connection metal pin 210 may be bent at a predetermined angle by the bending part 340.

For example, as shown in FIGS. 14 and 15, the bending part 340 may include two blocks 341a, 341b. In addition, the linear dented grooves 341h may be formed at the two blocks 341a, 341b such that at least a portion of the body 211 of the connection metal pin 210 is inserted therein. Further, the two blocks 341a, 341b are connected to each other using the hinge structure 345. Also, the two blocks 341a, 341b may be rotated with respect to each other in a state where the connection metal pin 210 is inserted into the dented groove 341h.

Thus, according to this configuration of the present disclosure, since the bending unit 300 includes the bending part 340, the body 211 of the connection metal pin 210 may be easily bent, thereby improving the manufacturing efficiency.

Further, referring to FIG. 2 again, after the arranging step, the manufacturing method may further include soldering the leg 216 of the connection metal pin 210, which passes through the connection hole H1 respectively formed at the at least two PCBs 100, 101, with the connection hole H1. Here, the soldering is a method of additionally bonding a molten solder so that the electrical connection between the leg 216 of the connection metal pin 210 and the connection conductor 220 formed in the connection hole H1 of the PCB 100 may be made more completely.

For example, the soldering may be reflow soldering. Specifically, the reflow soldering may be a method of applying a solder in the form of solder cream to a region to be bonded and then melting the solder to be soldered, during a PCB manufacturing process.

Meanwhile, even though the terms indicating directions such as upper, lower, left, right, front and rear directions are used in the specification, it is obvious to those skilled in the art that these merely represent relative positions for convenience in explanation and may vary based on a position of an observer or an object.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

| Reference Signs | |
|---|---|
| 200: PCB assembly | 100, 101: PCB |
| 210: connection metal pin | 211, 216: body, leg |
| H1: connection hole | 220: connection conductor |
| 212: fixing groove | 213: cantilever |
| 250: adhesive material | 230: angle fixing member |
| 111: fastening protrusion | K1: hooking structure |
| 113a, 113b: stopper protrusion | 300: bending unit |
| 310: grip part | 320: pressing part |
| 330: support part | 340: bending part |

INDUSTRIAL APPLICABILITY

The present disclosure relates to a PCB assembly. In addition, the present disclosure may be used in industries related to a battery pack equipped with the PCB assembly and an electronic device powered by a secondary battery.

What is claimed is:
1. A PCB assembly, comprising:
    at least two PCBs, each having a board with an upper surface and a lower surface relatively wider than horizontal side surfaces thereof, the board being partially perforated in an upper and lower direction to form a connection hole, a connection conductor electrically connected to a printed circuit provided on the board and being formed in the connection hole to be exposed outward, the at least two PCBs being arranged such that the upper surfaces or the lower surfaces of the boards are rotated to form a predetermined angle therebetween of the at least two PCBs; and a connection metal pin having a body and legs, the body having electric conductivity, and having a pin shape elongated in one direction, a portion of the body being bent according to the predetermined angle of the at least two PCBs arranged in a rotated state, portions of the legs being bent and respectively extended in another direction from opposite ends of the body, the bent and extended portions of the legs being inserted through the connection holes respectively formed in the at least two PCBs, and bent and extended terminals of the legs respectively being bent inward to be tightly fixed to the lower surfaces of the at least two PCBs, wherein a fixing groove is formed at the lower surface of each PCB to have an inner shape in which the bent and extended end of a leg of the legs of the connection metal pin is inserted and fixed.

2. The PCB assembly according to claim 1, wherein a cantilever having a protrusion shape protrusively extending toward the leg of the legs of the connection metal pin to block the leg of the legs of the connection metal pin inward from the outside and bent only in an inner direction is formed in the fixing groove.

3. The PCB assembly according to claim 1, wherein an adhesive material is buried and solidified in the fixing groove in which the leg of the legs of the connection metal pin is inserted and fixed.

4. The PCB assembly according to claim 1, wherein an extended longitudinal center portion of the body of the connection metal pin is bent according to the predetermined angle of the at least two PCBs arranged in the rotated state.

5. The PCB assembly according to claim 4, further comprising:

an angle fixing member having a linear fitting groove recessed inward so that a portion of the body of the connection metal pin is inserted and fixed therein.

6. A PCB assembly, comprising:

at least two PCBs, each having a board with an upper surface and a lower surface relatively wider than horizontal side surfaces thereof, the board being partially perforated in an upper and lower direction to form a connection hole, a connection conductor electrically connected to a printed circuit provided on the board and being formed in the connection hole to be exposed outward, the at least two PCBs being arranged such that the upper surfaces or the lower surfaces of the boards are rotated to form a predetermined angle therebetween of the at least two PCBs; and a connection metal pin having a body and legs, the body having electric conductivity, and having a pin shape elongated in one direction, a portion of the body being bent according to the predetermined angle of the at least two PCBs arranged in a rotated state, portions of the legs being bent and respectively extended in another direction from opposite ends of the body, the bent and extended portions of the legs being inserted through the connection holes respectively formed in the at least two PCBs, and bent and extended terminals of the legs respectively being bent inward to be tightly fixed to the lower surfaces of the at least two PCBs, wherein a fastening protrusion protruding outward is formed on the lower surface of each of the at least two PCBs, and wherein the fastening protrusion of one of the at least two PCBs has a hooking structure to meet another fastening protrusion and be fastened thereto.

7. A PCB assembly, comprising:

at least two PCBs, each having a board with an upper surface and a lower surface relatively wider than horizontal side surfaces thereof, the board being partially perforated in an upper and lower direction to form a connection hole, a connection conductor electrically connected to a printed circuit provided on the board and being formed in the connection hole to be exposed outward, the at least two PCBs being arranged such that the upper surfaces or the lower surfaces of the boards are rotated to form a predetermined angle therebetween of the at least two PCBs; and a connection metal pin having a body and legs, the body having electric conductivity, and having a pin shape elongated in one direction, a portion of the body being bent according to the predetermined angle of the at least two PCBs arranged in a rotated state, portions of the legs being bent and respectively extended in another direction from opposite ends of the body, the bent and extended portions of the legs being inserted through the connection holes respectively formed in the at least two PCBs, and bent and extended terminals of the legs respectively being bent inward to be tightly fixed to the lower surfaces of the at least two PCBs, wherein a stopper protrusion protruding outward is formed on the lower surface of at least one of the at least two PCBs to support the lower surface of another PCB of the at least two PCBs such that the another PCB does not rotate further.

8. A battery pack, comprising the PCB assembly according to claim 1.

9. An electronic device, comprising the battery pack according to claim 8.

10. A manufacturing method of a PCB assembly in which at least two PCBs are electrically connected, the manufacturing method comprising:

preparing at least two PCBs, each having a board with an upper surface and a lower surface relatively wider than horizontal side surfaces, the board being partially perforated in an upper and lower direction to form a connection hole, a connection conductor electrically connected to a printed circuit provided on the board and being formed in the connection hole to be exposed outward;

inserting both ends of a connection metal pin with electric conductivity into connection holes respectively formed in the at least two PCBs to electrically connect the connection conductors of the at least two PCBs;

bending both ends of the connection metal pin passing through the connection holes inward to be tightly fixed to the lower surfaces of the at least two PCBs; and arranging the at least two electrically connected PCBs such that the upper surfaces or the lower surfaces of the at least two PCBs are rotated to form a predetermined angle therebetween of the at least two PCBs, wherein the bending step is performed by a bending unit, wherein the bending unit includes:

a grip part having tongs to grip at least a portion of the connection metal pin to fix the connection metal pin;

a pressing part having a press to press the connection metal pin held by the grip part downward; and a support part having a concave groove recessed into a body of the support part to press each leg formed at the terminal ends of the connection metal pin so that each leg is bent in an inner direction of each PCB.

11. The manufacturing method according to claim 10, wherein the bending unit further includes a bending part having a bending jig to bend a body of the connection metal pin at a predetermined angle, and wherein in the arranging step, the bending part is used to bend a portion of the body of the connection metal pin at the predetermined angle.

12. The manufacturing method according to claim 10, after the arranging step, further comprising:

soldering each leg of the connection metal pin, which passes through the connection hole formed in each of the at least two PCBs, with the connection hole.

* * * * *